United States Patent [19]

Heeren

[11] 4,031,524

[45] June 21, 1977

[54] READ-ONLY MEMORIES, AND READOUT CIRCUITS THEREFOR

[75] Inventor: Richard H. Heeren, Palatine, Ill.

[73] Assignee: Teletype Corporation, Skokie, Ill.

[22] Filed: Oct. 17, 1975

[21] Appl. No.: 623,870

[52] U.S. Cl. .................. 340/173 R; 340/173 SP
[51] Int. Cl.² .................. G11C 11/40; G11C 17/00
[58] Field of Search ................ 340/173 R, 173 SP

[56] References Cited

UNITED STATES PATENTS

| | | | |
|---|---|---|---|
| 3,618,050 | 11/1971 | Heeren et al. ................ | 340/173 R |
| 3,838,404 | 5/1973 | Heeren ........................ | 340/173 R |
| 3,946,368 | 3/1976 | Chou ........................... | 340/173 R |

Primary Examiner—Terrell W. Fears
Attorney, Agent, or Firm—W. G. Dosse; M. Pfeffer

[57] ABSTRACT

A read-only memory and sense amplifier system for sensing whether a selected memory cell of a memory bank includes a high-impedance memory device, or a low-impedance device, and for generating a binary output signal representing stored data in response to the sensed difference. The cells are programmed with a pattern of high and low-impedance devices, such as inoperative and operative field-effect transistors in accordance with stored data. The memory bank, including the impedance of the selected cell, is connected to a first input node of the amplifier, and has either: (A) a first or "ON" bank impedance between the first node and a reference node, such as circuit ground, if the selected cell is in the low-impedance state: or (B) a second or "OFF" bank impedance if the selected cell is in the high-impedance state. A reference impedance is connected between the other amplifier node and the reference node, and has a value between the ON bank impedance and the OFF bank impedance. The amplifier includes circuitry for sensing a difference in impedance connected to the two nodes, and for generating the binary output signal in response to the sensed difference, representing the data stored in the selected memory cell.

26 Claims, 4 Drawing Figures

READ-ONLY MEMORIES, AND READOUT CIRCUITS THEREFOR

INTRODUCTION AND BACKGROUND

This application relates generally to read-only memories (ROM's) and more particularly to high-speed readout circuits for semiconductor ROM's.

In the past, semiconductor ROM's have been developed, involving X–Y matrices of field-effect transistors, particularly of the type known as MOSFETs, IGFETs, or by similar names. One typical example, is described in Heeren-Winston U.S. Pat. No. 3,618,050. This type of ROM involves an array of memory cells, each programmed during manufacture to have an operative field-effect transistor present or absent in the cell, in accordance with binary data permanently or semipermanently stored in the memory. X–Y accessing circuitry is provided to "select" the individual cells, when readout is required. This turns ON the cell transistor if an operative transistor was formed or is "present" in the selected cell, but does not turn on a cell "transistor" where either no transistor was formed or a potential transistor there formed is "inoperative" at the cell voltage employed. There are many ways to program the cells with a pattern of operative and inoperative transistors, such as growing thin (operative) or thick (inoperative) gate oxide, implanation of the gate channels so as to increase the threshold voltage of the inoperative devices, etc. The main feature of these devices is that, in one case, as for a stored binary 1, the cell transistor turns ON to present a low cell impedance, and for the other case, as binary 0, the "transistor" cannot turn ON, thus offering a high cell impedance.

To interrogate this type of ROM, and provide a binary output indicative of the stored data, various forms of readout devices have been proposed, two examples of which are disclosed in the Heeren-Winston patent. In general, such readout circuits, by one means or another, apply a voltage to the ROM cell, and then sense a difference in voltage at some point in the circuit based on whether the cell transistor is ON or OFF.

OBJECTS AND SUMMARY

In the past, all such readout circuits known to applicant have been relatively slow in operation, and a specific object of this invention is to provide high-speed readout circuitry for read-only memories of this general type.

More general objects are to provide improved read-only memories of the type employing variable-impedance cell devices to represent stored data, and improved readout systems for such memories.

With the foregoing and other objects in view, an improved readout circuit in accordance with certain features of the invention is used with a read-only memory bank of the type having an array of memory cells, and circuitry for accessing each individual cell. Each cell includes a memory device programmed to have either a high impedance or a low impedance, representing stored data. The improved readout circuit includes a sense amplifier having a pair of input nodes. In operation, the memory bank, including the selected cell impedance, is connected between a first one of the amplifier nodes and a circuit reference node, such as a circuit ground. The total impedance of the memory bank, including that of the selected cell, has a first, or "ON" value if the memory device in the selected cell is in the low-impedance state, and a second or "OFF" value if the memory device is in the high-impedance state. A reference impedance is connected between the other amplifier node and the reference node, the reference impedance having a value between the ON bank impedance and the OFF bank impedance. The sense amplifier includes circuitry for sensing a difference in impedance between the two amplifier nodes and for generating a binary output voltage in response to the sensed difference, which output represents the data stored in the selected memory cell.

Preferably, the memory is split into two equal banks of substantially equal impedance, a first bank being connected to a first amplifier node and the second bank being connected to the second amplifier node. In this embodiment, the accessing circuitry selects a memory cell in a selected one of the banks, and the reference impedance is connected in parallel with the opposite bank.

In accordance with a preferred embodiment, the memory banks comprise MOS memories having preset patterns of operative and inoperative field-effect transistors, coded oppositely in the two banks of the memory. In this embodiment, the reference impedance preferably comprises the source/drain resistance of a shunting field-effect transistor having a resistance that is high compared to the ON bank resistance, but low compared to the OFF bank resistance. Preferably, also, balanced, distributed load capacitances of the two memory banks are also connected to the amplifier nodes, and constitute portions of the sensing circuitry of the amplifier. In this example, a supply voltage is applied to both nodes during a sensing portion of a cycle, and a flip-flop circuit responds to differences in charge between the two load capacitances, so as to ground one of the nodes and to allow the other to charge to the supply voltage. The binary output signal may then be taken from either of the two nodes, one node being the complement of the other.

Other objects, advantages and features of the invention will be apparent from the following detailed description of specific examples and embodiments, when taken in conjunction with the appended drawings of such embodiments.

DRAWINGS

In the drawings,

FIG. 1 is a circuit diagram of portions of a read-only memory and a sense amplifier, in accordance with one specific embodiment of the invention.

FIG. 2, consisting of A through H, is a timing diagram illustrating two cycles of operation of the system.

DETAILED DESCRIPTION

Introduction & Background — General Layout of ROM Cells & Sense Amplifier

Figure 1:
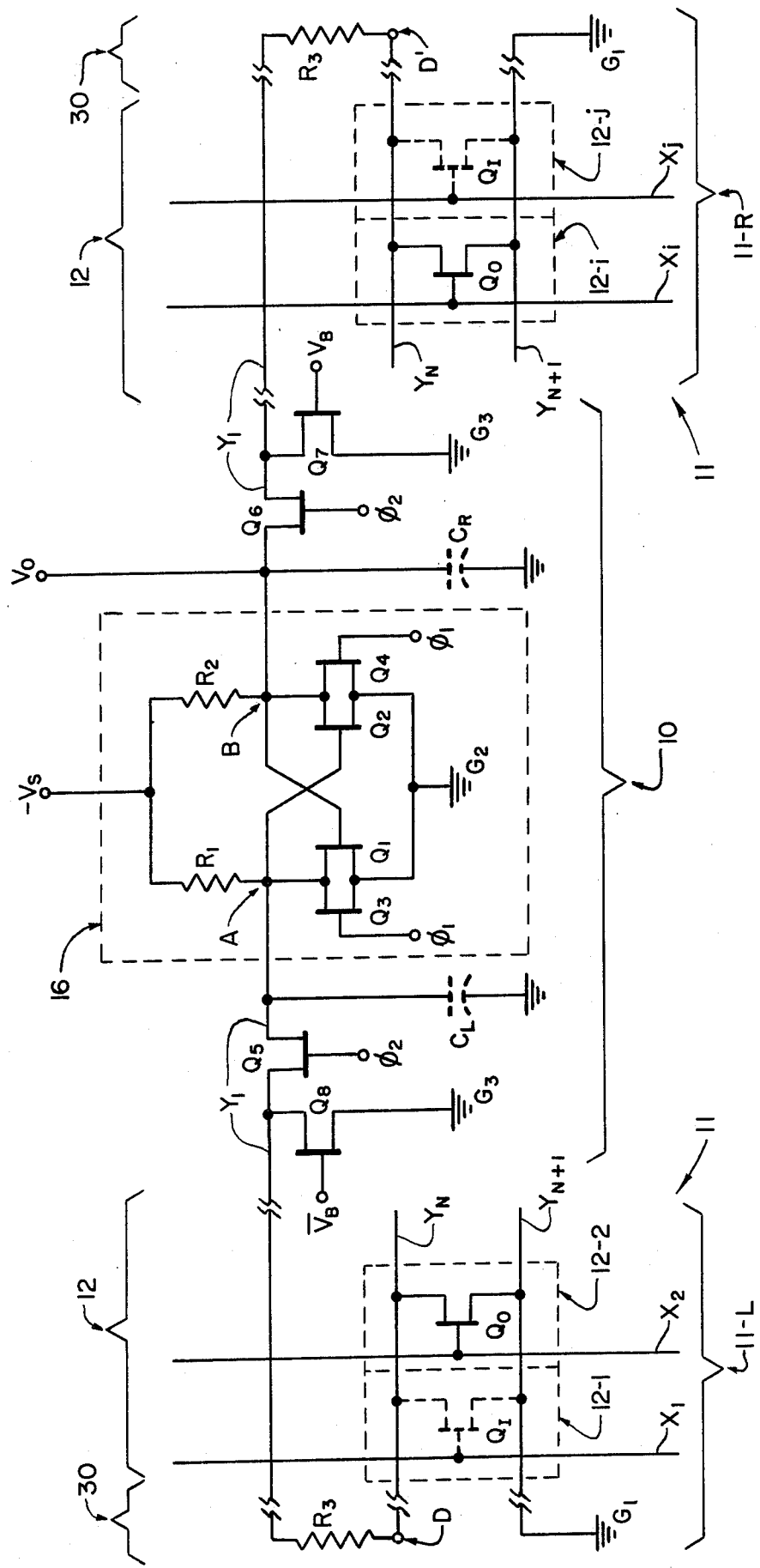

Referring now in detail to the drawings, FIG. 1 illustrates a sense amplifier 10 for a semiconductor read-only memory (ROM) 11 in accordance with a first specific embodiment of the invention. The memory 11 is split into two equally balanced sections or banks, 11-L and 11-R, located respectively on the left and right sides of the amplifier 10, as viewed in FIG. 1. Each bank includes a plurality of individual ROM cells 12, four typical ones of which are shown in FIG. 1, designated 12-1, 12-2, 12-$i$ and 12-$j$ and located half in the left bank 11-L and half in the right bank 11-R.

A typical memory includes a large number of parallel cells 12, in each of a number of parallel rows of the memory. Any selected cell 12 can be connected to the amplifier 10 by an input/output conductor or bus $Y_1$. A selected cell in the left bank 11-L, such as 12-1, is connected by the $Y_1$ bus on the left to a first input node A of the amplifier 10 during a sensing portion of the cycle; conversely, a cell in the right bank, such as 12-$i$, is connected to a second input node by the $Y_1$ bus on the right.

Each memory cell 12 is located at a crosspoint in an X–Y matrix array of the cells, as is well known in the art. In FIG. 1, the ROM cells 12-1 . . . 12-$j$ are defined at the intersections between a plurality of column conductors $X_1$. . . $X_j$, one for each column of cells, and a plurality of perpendicular row conductors or busses, designated $Y_1$. . . $Y_N$, $Y_{N+1}$. Each cell 12 is formed in the space or gap between two adjacent row conductors, such as $Y_N$ and $Y_{N+1}$, and includes a portion of the associated column conductor, such as $X_1$, $X_2$, as indicated by the dotted rectangles in FIG. 1.

In the specific embodiment of FIG. 1, each memory cell 12 includes either (1) an operative field-effect transistor, designated $Q_O$ and shown in solid lines in cells 12-2 and 12-$i$; or (2) an inoperative "transistor" designated $Q_T$ and shown in dotted lines in cells 12-1 and 12-$j$. As is well known in the art, and as described in the Heeren-Winston U.S. Pat. No. 3,168,050, the pattern of operative and inoperative cell transistors $Q_O$ and $Q_I$ (transistors effective "present" or "absent") for any specific memory 11 is programmed during manufacture in a specific pattern, characteristic of that ROM and set by a specific combination of binary data (1's and 0's) preset to be read out by the sense amplifier 10 from the particular ROM. In the example of FIG. 1 the source/drain terminals of each cell transistor $Q_O$ and $Q_I$ (whether operative or inoperative) are connected between two adjacent row conductors, such as $Y_N$ and $Y_{N+1}$, and the gate is connected to the associated X conductor $X_1$. . . $X_j$.

In the example of FIG. 1, using generally conventional P-channel MOSFETs, the row conductors or busses, such as $Y_1$, $Y_N$, and $Y_{n+1}$ are elongated, parallel P diffusions running across the width of the chip, from right-to-left as laid out in FIG. 1. The column or "access" conductors $X_1$. . . $X_j$ are parallel aluminum metalizations, comprising gate conductors for the cell transistors $Q_O$, $Q_I$ and running the length of the chip from top-to-bottom as viewed in FIG. 1.

The data stored on any selected ROM cell 12 is sensed, as will be disclosed in more detail in the following sections, by connecting a sensing potential or input supply voltage $-V_S$ to a selected cell node, such as a cell node D in the left bank 11-L, that is associated with the row of cells 12-1, 12-2 formed between the bottom two adjacent row conductors $Y_N$ and $Y_{N+1}$ in FIG. 1. Simultaneously, a gate potential $-V_G$ is applied to the column conductor $X_1$. . . $X_j$ associated with the selected cell. For example, to read the cell 12-1, X-decoding circuitry functions to apply the gate potential $-V_G$ to only the column conductor $X_1$, and Y-decoding circuitry operates to connect the selected row conductor $Y_N$ to the amplifier input/output bus $Y_1$ on the left.

The X and Y decoding circuitry may be conventional, one preferred system being described in part hereafter and in detail in the Heeren-Winston patent.

As is conventional, the X bus gate potential $-V_G$ is set at a level, such as $-5$ volts in a typical example, to turn ON an operative cell transistor $Q_O$ if present, but not to turn ON an inoperative cell "transistor" $Q_I$ where present. This provides the basic definition herein as transistors being "operative" or "inoperative," or being "present" or "absent." For example, when the column conductor $X_2$ is energized to read cell 12-2, the operative transistor $Q_O$ in that cell 12-2 turns ON and connects the sensing potential $-V_S$ at node D and on the row conductor $Y_N$ to a circuit reference node, such as a circuit ground $G_1$ connected to the adjacent bus $Y_{N+1}$. Conversely, when the adjacent cell 12-1 is selected, the inoperative "transistor" $Q_I$ cannot turn ON to connect node D to the ground $G_1$.

As will be explained in the following sections, this connection of a cell node such as D to ground $G_1$ through an operative ROM transistor $Q_O$ triggers the sense amplifier 10 to generate an output signal $V_O$ at a first one of two binary levels, corresponding to either a binary 1 or a 0 depending on the logic code used in the system. This first output level indicates that a transistor was present in a selected cell such as 12-2 in the left bank 11-L. Conversely, when a cell such as 12-1 is selected, where an operative transistor is not present, the sensing potential $-V_S$ at node D is blocked from ground $G_1$ during the sensing portion of the cycle, and the amplifier 10 generates a second or inverse output at $V_O$, indicating that an operative transistor is not present in cell 12-1.

Similar events occur when a cell such as 12-$i$ or 12-$j$ in the right bank is selected, wherein the sensing potential $-V_S$ applied to a corresponding cell node D' is conducted to the reference node, such as circuit ground $G_1$, through $Q_O$ when cell 12-$i$ is selected by access conductor $X_i$, but not through $Q_I$ of cell 12-$j$ when $X_j$ is selected.

As is well known, the pattern of cell transistors (present or absent) may be programmed in many different ways. One standard technique, as described in the Heeren-Winston patent, is to grow a normal "thin" gate oxide where an operative transistor $Q_O$ is wanted, but to grow "thick" oxide where no transistor ($Q_I$) is wanted. The gate oxide in this instance is sufficiently thick to prevent the potential or "hypothetical" transistor $Q_I$ from turning ON at the gate voltage $-V_G$ customarily used on the column conductors $X_i$. . . $X_j$, such as $-5$ volts in a typical example. As will be described in further detail hereafter, an alternative procedure for programming the cells 12, which is very attractive in combination with the sense amplifier 10 of this application, is disclosed in my copending application "Semiconductor Read-Only Memory and Method of Making," Ser. No. 551,173, filed Feb. 19, 1975, herein incorporated by reference.

In the specific embodiments and examples described herein, all transistors or logic gates illustrated are generally conventional P-channel MOS devices; thus, the gate and drain voltages applied are negative voltages of the appropriate level, and the sources of all transistors in the last row of cells 12-1 to 12-$j$, are connected to the common circuit reference node, such as round $G_1$, by a final P diffusions $Y_{N+1}$ at the bottom of FIG. 1. Of course, it should be understood that N-channel devices, with positive inputs, or various other kinds of gating devices could equally well be used for accomplishing the described functions.

SENSE AMPLIFIER 10

The sense amplifier 10 is arranged to sense a difference in conductivity between a selected adjacent pair of row conductors, such as $Y_N$ and $Y_{N+1}$, depending on whether an operative transistor $Q_O$ or an inoperative transistor $Q_I$ is present in the selected cell 12 in that row and to generate the binary output signal $V_O$ having one level if a transistor is present and the opposite or inverse level if a transistor is absent. As is customary in this general type of MOS digital logic system, the first output level is approximately equal to the input supply voltage $-V_S$ (for example, $-5$ volts) and the second level is circuit ground potential, or approximately zero volts.

The sense amplifier 10 includes a generally conventional flip-flop circuit 16, various examples of which are described in my prior U.S. Pat. No. 3,838,404, herein incorporated by reference. In the embodiment illustrated in FIG. 1 of this application, corresponding to FIG. 4 of the patent, the flip-flop circuit 16 includes a pair of balanced flip-flop transistors $Q_1$, $Q_2$ having their gates and drains cross coupled as shown, to provide the binary output $V_O$ (essentially $-V_S$ or 0 volts) at the amplifier node B, in accordance with the operation of the flip-flop transistors $Q_1$, $Q_2$. As described in the patent, the output signal $V_O$ may be taken from either node A or node B, the signal at node A always being the complement or inverse of that at node B at the end of each sensing cycle.

In the embodiment of FIG. 1, the flip-flop circuit also includes a pair of balanced, voltage-presetting transistors $Q_3$ and $Q_4$, having their source-drain terminals respectively connected in parallel to those of $Q_1$ and $Q_2$ and their gates connected to a first clock $\mathbf{0}_1$. As illustrated in FIG. 2A, during a first or "preset" phase (a) of each cycle, timwes $t_0-t_2$, the $\mathbf{0}_1$ clock pulse goes negative to turn ON the presetting transistors $Q_3$ and $Q_4$. During the preset phase, the transistors $Q_3$ and $Q_4$ conduct the input supply voltage $-V_S$ to a reference node, such as a circuit ground $G_2$, through a pair of balanced load resistors $R_1$ and $R_2$ connected respectively between the input $-V_S$ and the amplifier nodes A and B. As described in my U.S. Pat. No. 3,838,404, the load resistors $R_1$, $R_2$ preferably are ON-biased FETs operating as load resistors.

The purpose of the transistors $Q_3$ to $Q_4$ is to preset an equal initial refrence voltage $V_R$ at both nodes A and B during the preset phase (a) of each cycle. In the embodiment illustrated herein, the reference voltage is approximately zero volts, as described in connection with FIGS. 3 and 4 of my U.S. Pat. No. 3,838,404. However, the initial reference voltage $V_R$ can be any selected voltage between approximately zero volts and the input voltage $-V_S$. As previously mentioned, at the start of each cycle, time $t_0$, one of the nodes A and B is always at approximately $-V_S$ and the other is at approximately zero volts. In the embodiment of FIG. 1, the transistors $Q_3$ $Q_4$ function to ground both nodes A and B during the preset phase (a), so that the potential at both nodes equalizes at a potential near ground promptly after time $t_0$, as indicated by the dotted lines 20 in FIGS. 2B and 2C.

With the potential at nodes A and B thus equalized at near ground potential, in this embodiment, a pair of balanced, distributed load capacitances $C_L$ and $C_R$ connected respectively to the left and right nodes A and B are thus predischarged to near ground potential. As explained in more detail in my U.S. Pat. No. 3,838,404, the load capacitances $C_L$ and $C_R$ operate in a racing mode during a sensing phase (b) of each cycle, to set the flip-flop output $V_O$ to one binary level or the other based on a sensed differential charging rate between the load capacitances $C_L$ and $C_R$. During a first portion, times $t_o-t_1$, of the preset phase (a), the memory banks 11-L and 11-R are isolated from their corresponding amplifier nodes A and B by a pair of switching transistors $Q_5$ and $Q_6$, located one on either side of the amplifier 10.

TYPICAL CYCLES OF OPERATION — EXAMPLE I, SENSE $Q_O$ AT CELL 12-2

Figure 2:
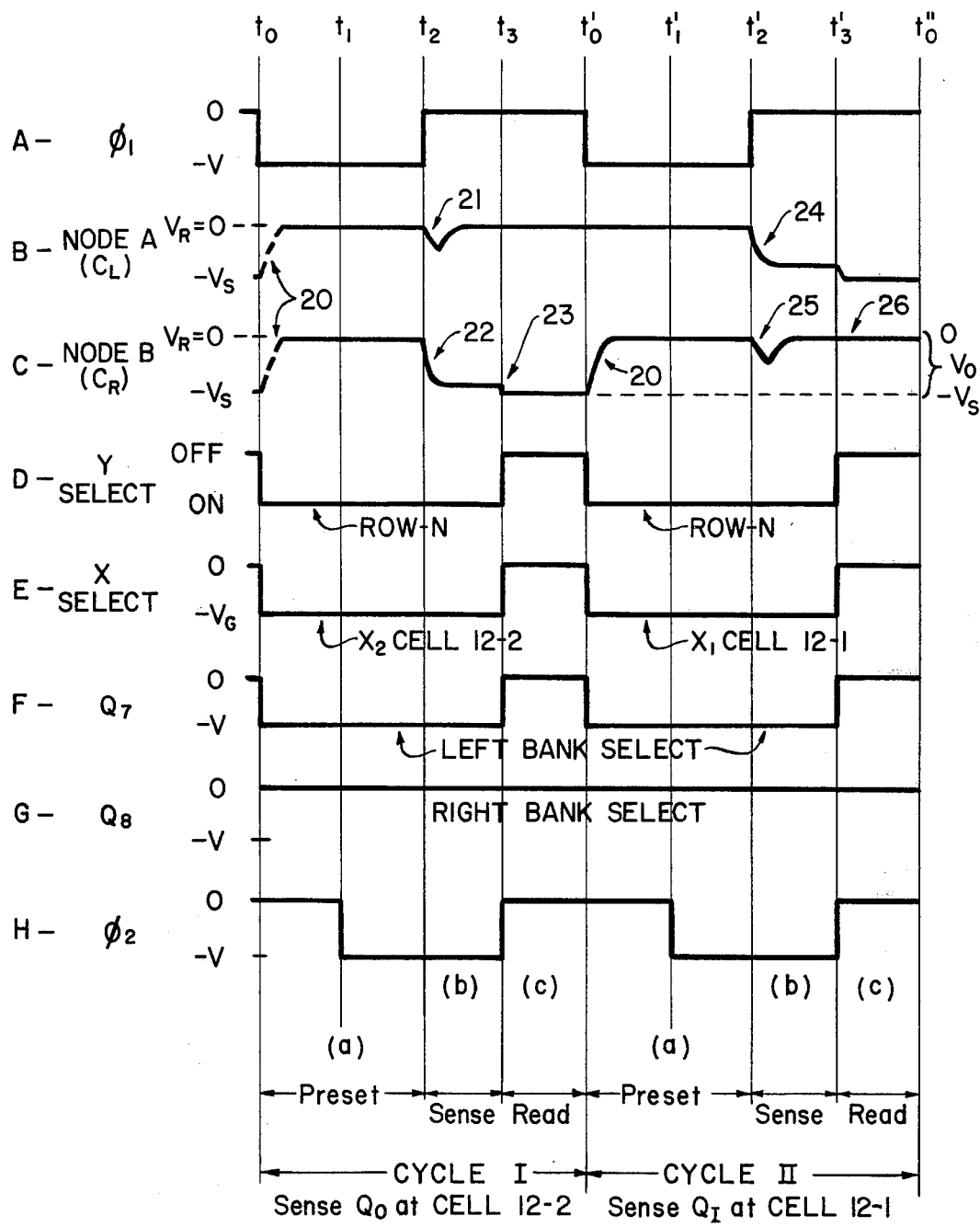

In a first specific example of operation, designated cycle I at the left of FIG. 2, the amplifier 10 is to sense the operative transistor $Q_O$ in cell 12-2 of the left bank 11-L. At time $t_o$, the Y-decoding circuitry functions (FIG. 2D) to select the desired pair of row conductors as previously described, in this example the space between the last two adjacent Y bussess, $Y_N$ and $Y_{N+1}$. The Y-decoding circuitry is designated generally by the numeral 30 in FIG. 1, but not shown, and one embodiment will be described in more detail hereafter with respect to FIG. 4. However, as previously described, the general function of the Y-decoding circuitry 30 is to connect all Y busses, except for the selected pair, to each other and to the input/output bus $Y_1$. In this example, where the selected cell 12-2 lies in the bottom row $Y_N/Y_{N+1}$, the $Y_N$ bus is connected to all higher busses (not shown in FIG. 1) and to the top bus $Y_1$, which is connectable to the amplifier node A when the switching transistor $Q_5$ is operated, during times $t_1$ to $t_3$ as described hereafter.

The Y-decoding circuits 30 for both banks 11-L and 11-R are simultaneously operated at time $t_o$, which establishes a standard cell resistance $R_3$ on each side of the ROM, between nodes A and D on the left and between nodes B and D' on the right. Since the memory and decoding cells are equal in number and layout and are fabricated identically in each bank 11-L and 11-R, the standard cell resistances $R_3$ are essentially identical on each side.

Figure 3:
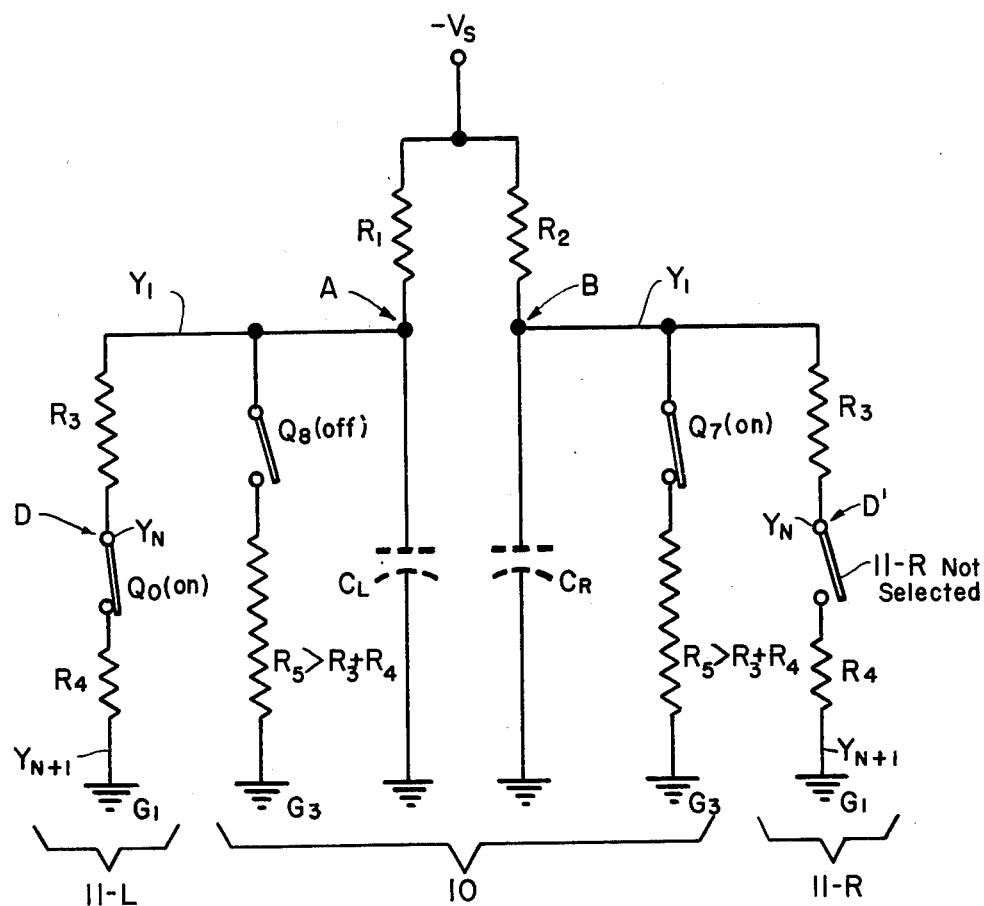
FIG. 3 is a schematic network diagram illustrating principles of operation.

In addition, at time $t_o$, the selected X-access conductor $X_1 \ldots X_j$ is energized to turn ON the cell transistor if present (operable transistor $Q_O$) in the selected cell. In this example, (FIG. 2E), the $X_2$ column conductor is driven to $-V_G$ to turn ON the operative transistor $Q_O$ formed in the selected cell 12-2. None of the X conductors, such as $X_i$, or $X_j$, in the right bank is energized, so that the selected Y busses $Y_N$ and $Y_{N+1}$ on the right bank cannot be connected together and to the ground $G_1$ of the right bank during any left-bank cycle. Therefore, the total cell resistance $R_3$ on the right remains constant throughout all sensing cycles involving cells in the left bank. Thus, during the first portion of the preset phase (a) of each cycle, times $t_o$ to $t_1$, the amplifier nodes A and B are preset by the $\mathbf{0}_1$ clock to the same reference voltage $V_R$, 0 volts in this embodiment; and the X and Y decoding circuitry operate to select one specific of cell 12-2 in this example, to turn ON an operative cell transistor $Q_O$ (if present) and to connect the source-to-drain resistance $R_4$ of an operative transistor $Q_O$ between the amplifier node A and the cell ground $G_1$, series with the standard cell resistance $R_3$ as shown in FIG. 3. However, $Q_5$ and $Q_6$ remain OFF from $t_o$ to $t_1$, to keep the cell banks 11-L and 11-R isolated from the amplifier nodes A and B during the first portion of the preset phase (a).

In addition to the foregoing preset operations, at time $t_o$, one of two "bank-select" or shunting transistors $Q_7$ and $Q_8$ is turned ON, to connect a reference impedance $R_5$ between the $Y_1$ bus and a reference node, such as a circuit ground $G_3$, in parallel with the non-selected bank 11-L or 11-R, as shown in FIG. 3. In the example under consideration, in which a cell 12-2 in the left bank 11-L is selected, the transistor $Q_7$ on the right is turned ON (FIG. 2F), by a pulse $V_B$ at the gate of $Q_7$, to connect $Y_1$ on the right to ground $G_3$ through $R_5$, in parallel with the right bank of cells 11-R. Conversely, when a cell such as 12-$i$ in the right bank 11-R is selected, the transistor $Q_8$ on the left is turned ON, by a complementary pulse $\overline{V}_B$, to connect $R_5$ on the left in parallel with the nonselected left bank 11-L. During the cycles I and II in FIG. 2, both involving cells on the left side, $Q_8$ remains OFF as shown in FIG. 2G. Preferably, the reference impedance $R_5$ consists of the source-to-drain impedance of the shunting transistor $Q_7$ or $Q_8$, but where necessary for proper balance, an additinal diffused P resistor area can be used.

To continue with the first example of a cycle of operation, cycle I in FIG. 2, at time $t_1$, a second clock pulse $0_2$ goes negative (FIG. 2H), to turn ON the two switching transistors $Q_5$ and $Q_6$, thus connecting the left bank of cells 11-L to the left amplifier node A and connecting the right bank of cells 11-R and the shunting transistor $Q_7$ to the right amplifier node B. During a period of overlap between the $0_1$ and $0_2$ pulses, times $t_1$ to $t_2$, nodes A and B remain grounded through the presetting transistors $Q_3$ and $Q_4$ so that any charge previously extant in either bank of memory cells discharges to ground through $Q_3$ or $Q_4$ (and $Q_7$) to equalize the potential on both sides of the system at approximately zero volts in this example, prior to the cycle time $t_2$. At this time, $t_2$, the preset phase (a) of the cycle is complete and the system is prepared for the sensing operation.

At cycle time $t_2$, the $0_1$ clock pulse returns to ground (while the $0_2$ pulse persists), thus turning OFF the presetting transistors $Q_3$ and $Q_4$ of the flip-flop 16 and isolating the amplifier nodes A and B from ground connection $G_2$. At this time, the input supply voltage $-V_S$ is applied through the balanced load resistors $R_1$ and $R_2$ to both nodes A and B, so as to begin charging the balanced load capacitances $C_L$ and $C_R$ toward the supply voltage $-V_S$. Referring also to the schematic charging diagram of FIG. 3, the supply voltage $-V_S$ would normally charge the balanced load capacitances $C_L$ and $C_R$ at the same rate, except for differences in impedance between the left and right banks 11-L and 11-R of the memory.

In the example of FIG. 3, being an illustration of cycle I of FIG. 2, on the left side, the load capacitance $C_L$ charges in parallel with the series connection of the standard cell resistance $R_3$ of the left bank 11-L and the resistance $R_4$ of the operative transistor $Q_O$ of the selected cell 12-2, to the cell ground $G_1$. On the right, $C_R$ charges in parallel with the reference impedance $R_5$ of the shunting transistor $Q_7$ to ground $G_3$.

In the practice of the invention, the resistance $R_5$ of the shunting transistor $Q_7$ is made relatively large compared to that of an ON memory bank 11-L; that is the saturated cell resistance $R_3$ plus the ON cell resistance $R_4$. In this case, the right load capacitance $C_R$ (on the opposite side from the cell in question) charges faster then the left load capacitance $C_L$, as indicated by curves 21 and 22 in FIGS. 2B and C. As this differential charging pattern is established, node B on the right charging faster than node A, the higher negative voltage at node B promptly turns ON the left side flip-flop transistor $Q_1$, which discharges node A to ground $G_2$ through $Q_1$, as described in my prior U.S. Pat. No. 3,838,404. This prevents the flip-flop transistor $Q_2$ on the right from turning ON during this cycle, and the voltage at the node B builds up toward the supply voltage $-V_S$, as indicated by curve 23 in FIG. 2C. At this point, the sensing phase (b) of the cycle has been completed, times $t_2$ to $t_3$.

At time $t_3$, the "bank select" input $V_B$ returns to zero (FIG. 2F), and the transistor $Q_7$ turns OFF, at which point the amplifier output node B charges to the full supply voltage $-V_S$ during a read phase (c) of the cycle, times $t_3$ to $t'_o$ in FIG. 2. Thus, a $-V_S$ output at $V_o$ after time $t_3$ indicates that an operative transistor was present in any selected cell, such as 12-2, in the left bank. The $V_o$ output may be read in any conventional manner, for example as described in the Heeren-Winston patent previously mentioned, or my U.S. Pat. No. 3,838,404.

At time $t_3$, the $0_2$ pulse returns to ground (FIG. 2H) to isolate the memory banks 11-L and 11-R from the amplifier nodes A and B, and the X and Y address circuits are de-energized (FIGS. 2D and 2E) to return the memory banks to their initial, nonselected state.

EXAMPLE II, SENSE $Q_I$ AT CELL 12-1

In cycle II at the right of FIG. 2, a cell such as 12-1 on the left is selected, having an inoperative cell transistor $Q_I$. In this case, the layout is exactly the same as in FIGS. 2 and 3, except that this time the cell node D is not connected to ground $G_1$ through a cell transistor source/drain impedance $R_4$, since the inoperative "transistor" $Q_I$ is, in effect, an OFF switch. In cycle II of FIG. 2, the preset phase, $t'_o$ to $t'_2$ is exactly the same as in cycle I of FIG. 2. However, in this cycle, after time $t'_2$, node A changes faster than node B (arrows 24, 25, in FIG. 2B and C), since the parallel circuit from node A to ground through $R_3$ and $R_4$ is not available in this case. The inoperative transistor $Q_O$ presents a very high resistance between node D and ground $G_1$ on the left, consisting only of leakage current through $Q_I$ (and other OFF transistors in parallel, such as $Q_O$ of the adjacent cell 12-2). The reference impedance $R_5$ of $Q_7$ is made very low compared to an OFF cell resistance. Thus, in this cycle II, the potential at node A builds up much faster than at node B and the flip-flop transistor $Q_2$ on the right turns ON. Thus, node B discharges to ground $G_2$ to provide a node B output $V_o$ approaching zero volts during the read phase of cycle II, times $t'_3$ to $t''_o$, as indicated by the line 26 in FIG. 2C. As in the previous cycle, the load capacitance charging cycle and flip-flop operation are the same as described in my prior U.S. Pat. No. 3,838,404.

When a cell such as 12-$i$ or 12-$j$ in the right bank is selected, the operation is the same except that the bank-select, shunting transistor $Q_8$ on the left is selected, rather than $Q_7$ as in the prior examples. Also, the amplifier output at $V_O$ in right-bank cycles is inverted from that of left-bank cycles, meaning that a zero output at $V_O$ indicates an operative transistor $Q_O$ on the right, as in cell 12-$i$, whereas a $-V_C$ output at $V_o$ indicates transistor $Q_I$ as in cell 12-$j$. To account for this difference in output signals from one bank to the other, when programming the ROM in the first instance, 1's and 0's are assigned oppositely in the left and right banks. For instance, in the example given above, where the output $V_O$ is taken from node B on the right, an operative transistor $Q_0$ in a left-bank cell (such as cell 12-2, cycle I) may represent binary 1, whereas on the right (as in cell 12-$j$), an inoperative transistor represents binary 1. In both cases, the amplifier output $V_O$ at node B is $-V_S$. Conversely, binary 0 consists of an inoperative transistor on the left (12-1) or an operative transistor (12-$i$) on the right, providing an output $V_O$ of zero volts, as in cycle II.

ROM CELL/DECODE SYSTEM

Figure 4:
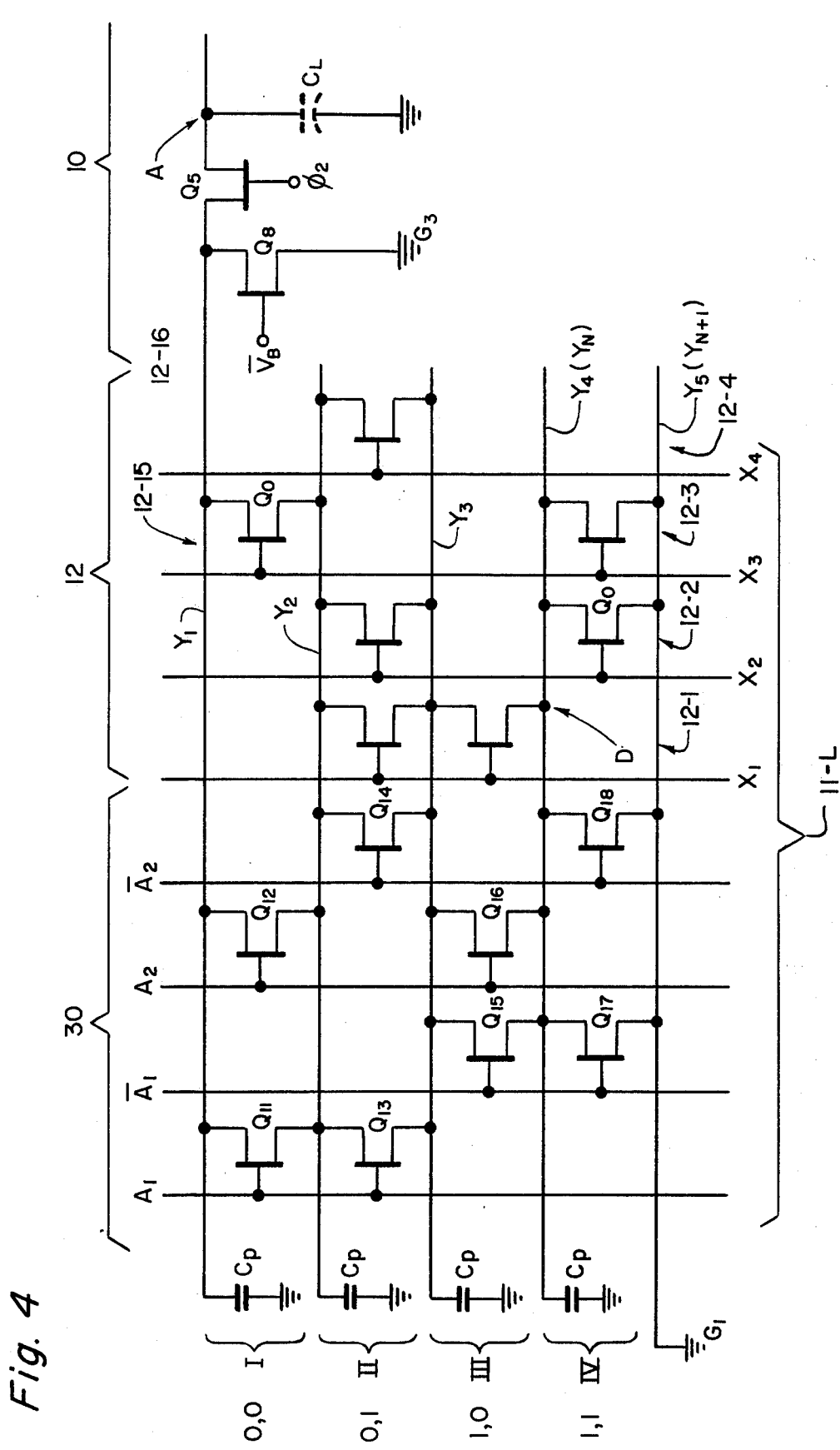
FIG. 4 is a circuit diagram of a memory cell array and decoding circuitry in accordance with one specific embodiment of the invention.

Referring to FIG. 4, a layout of a portion of a typical ROM cell array, such as 11-L, with Y-decoding circuitry 30 is illustrated. In this embodiment, the Y-decoding circuitry 30 is generally as illustrated in FIG. 5 of the Heeran-Winston patent previously cited. The example of FIG. 4 is a highly simplified one, involving a 16 bit memory array of cells 12, with four X access conductors $X_1$, $X_2$, $X_3$ and $X_4$, of which $X_1$, $X_2$ correspond to $X_1$ and $X_2$ of FIG. 1. The Y decoder involves five row busses $Y_1$ to $Y_5$ of which $Y_4$ and $Y_5$ correspond to $Y_N$ and $Y_{N+1}$ in FIG. 1, and $Y_1$ is the input/output bus to amplifier node A as in FIG. 1. In FIG. 4, only the operative transistors $Q_0$, as in cell 12-2 along the bottom, are shown; the inoperative transistors as in cell 12-1 being left blank in FIG. 4.

The Y decoder 30 responds to a two-bit data input signal $A_1$, $A_2$, to provide a one-out-of-four output to select one of four memory rows designated I, II, III and IV in FIG. 4. Row I corresponds to the space between the $Y_1$ and $Y_2$ busses; Row II to the space between the $Y_2$ and $Y_3$ busses; Row III, $Y_3$ and $Y_4$; and Row IV, $Y_4$ and $Y_5$ (corresponding to $Y_N$ and $Y_{N+1}$ in FIG. 1). The bottom row $Y_5$ is connected to the cell ground $G_1$, as previously described.

The Y decoder includes a group of eight decoding transistors $Q_{11}$ to $Q_{18}$, arranged in a pattern as shown at the left in FIG. 4. The gates of $Q_{11}$ and $Q_{18}$ are connected to data input leads $A_1$, $\overline{A_1}$, $A_2$ and $\overline{A_2}$, wherein A represents the value of the first data bit, $A_1$ the complement, $A_2$ the second bit, and $\overline{A_2}$ its complement, as described in the Heeran-Winston patent and in my copending application "A Dynamic Logic System," Ser. No. 822,250, filed May 7, 1969.

For example, if $A_1=1$ and $A_2=1$, inputs $A_1$ and $A_2$ are at $-V_G$ and $Q_{11}$, $Q_{13}$, $Q_{12}$ and $Q_{16}$ all turn ON. This "selects" Row IV, meaning that $Q_{11}$ and $Q_{12}$ connect bus $Y_1$ to $Y_2$; $Q_{13}$ connects bus $Y_2$ to $Y_3$; and $Q_{16}$ connects $Y_3$ to $Y_4$. For this 1, 1 input combination, $Q_{17}$ and $Q_{18}$ are both OFF, and there thus is no connection in the Y-decoding section of the memory between the last two busses $Y_4$ and $Y_5$ (corresponding to $Y_N$ and $Y_{N+1}$ in FIG. 1).

This is the example previously described in connection with FIG. 1, in which the selected pair of busses $Y_4$ and $Y_5$ is either connected or not connected, depending on whether there is an operative transistor in the selected cell 12-1 to 12-4 in Row IV, as at cell 12-2 previously described or cell 12-3 in FIG. 4. The total source/drain resistance of the ON network of four Y-decoding transistors, $Q_{11}$ and $Q_{12}$ in parallel, and in series with $Q_{13}$ and $Q_{16}$, comprises the standard cell resistance $R_3$ previously described.

Similarly, if $A_1=1$ and $A_2=0$ gate busses $A_1$ and $A_2$ go to $-V_G$ at cycle times $t_0$ to $t_3$ in FIG. 2. In this case and $Q_{11}$, $Q_{13}$, $Q_{14}$ and $Q_{18}$ turn ON, thus selecting Row III as the "vacant" row of the memory for sensing. Note, in this example, that the total cell resistance $R_3$ of the Y decoding transistors is the same as in the previous example, since four decoding transistors 11, 13, 14 and 16 are also connected between the amplifier node A and the ROM ground $G_1$, two of which ($Q_{13}$ and $Q_{14}$) are again in parallel. As will be apparent, Row II is selected for the combination 0, 1 and Row I for 0, 0 according to the truth table at the left of FIG. 4. But in all cases, the total ON memory bank resistance $R_3+R_4$ is the same regardless of which row of cells (I to IV) is selected; thus, the resistive comparision of an ON bank 11-L ($R_3 + R_4$) with the substantially larger resistance $R_5$ of the shunting transistor $Q_7$ remains valid, regardless of which row is selected by the Y decoder 30, or which bank 11-R or 11-L is selected.

The $X_1$ to $X_4$ column select inputs in FIG. 4 may be generated by any convenient X decoder, or other logic circuit; for example, as shown in FIG. 2 of the Heeran-Winston patent. As is conventional, the four combinations $X_1$ to $X_4$ of X inputs, and Rows I to IV of Y inputs can access any one of 16 selected cell locations, such as 12-1 to 12-16 in the memory bank 11-L. As previously explained, there is always an equal number of ROM cells 12, and an identical Y decoder 30 in the right bank 11-L. In the example of FIG. 4, the right bank would have four different X address inputs $X_5$ to $X_8$ (not shown) two of which correspond to X$i$ and X$j$ in FIG. 1, so that the impedance of the two banks is always balanced and a 32 bit memory is thus provided.

Of course, in practical memories of this kind, there are typically a very large number of memory cells 12 and decoding transistors in each bank. For example, in a 4096 bit read-only memory, generally referred to as a "4K ROM," there could be 32 X-address conductors $X_1$ to $X_j$ in each bank and 64 Y rows $Y_1$ to $Y_N$ in each bank, providing 2048 cells or bits in each bank, for a total of 4096 stored bits. In this typical layout, one of the 64 Y rows is selected by the 64 possible combinations of six A-address input leads $A_1$ to $A_6$ and their complements $A_1$ to $A_6$, as is well known, In this example, a "4K × 1" ROM is provided, meaning the all 4096 stored bits are sensed and read by a single sense amplifier 10 located between the two memory banks 11-L and 11-R. Various other layouts are possible, such as a 256 × 8 bit arrangement, involving eight individual sense amplifiers 10, each connected to two 128 bit memory banks 11-L and 11-R, for a total of 256 bits per amplifier. This type of arrangement is desirable where a multiple readout, such as an 8-bit sequential readout is desired.

As generally described in my U.S. Pat. No. 3,838,404, the load capacitances $C_L$ and $C_R$ preferably comprise the inherent distributed capacitance of the operative Y busses on each side, designated $C_P$ for each row at the left in FIG. 4, for the left bank 11-L. As previously mentioned, since the corresponding Y-address circuitry 30 on both sides is operated during every cycle, and since the two sides are fabricated as identically as possible during manufacture, the two load capacitances $C_L$ and $C_R$ are essentially equal on each side, regardless of which row of the memory is selected.

For example, if the top Row I is selected ($A_1$, $A_2 = 0$, 0), $C_L$ and $C_R$ are both equal to the intrinsic bit line capacitance $C_P$ of the $Y_1$ input/output conductor. This distributed capacitance $C_P$ is primarily the drain-to-gate and drain-to-substrate capacitance of the transistors in that row, including $Q_{11}$ and $Q_{12}$ in the Y-decoding section 30, plus operative transistors in the memory section, such as $Q_0$ in cell 12-15.

Where Row II is selected, $C_L$ and $C_R$ include the total bit-line capacitance of both the $Y_1$ and $Y_2$ busses, since $Y_2$ is connected to $Y_1$ through $Q_{11}$ and/or $Q_{12}$ in all Row II cycles on both sides. Similarly, in Row III cycles $C_L$ and $C_R$ equal the total capacitance of $Y_1+Y_2+Y_3$; and in Row IV cycles, $Y_1+Y_2+Y_3+Y_4$. Thus, while the absolute values of $C_L$ and $C_R$ vary from cycle to cycle, depending on which row is selected, the values are always substantially equal on both sides. For this reason, the sensing process is not affected by changes in the absolute value of $C_L$ and $C_R$.

As previously mentioned, the sensing circuit of this application is particularly useful with the memory cell structure of my copending application, Ser. No. 557,137, filed Feb. 19, 1975. As described in that application, transistors are programmed to be operative ($Q_O$) or inoperative ($Q_I$) in the ROM cells 12 by selectively doping the gate channels to levels such that the "transistors" will or will not turn ON at the gate voltage used, for example, −5 volts. For example, where an operative transistor $Q_O$ is wanted, the transistor $Q_O$ is formed normally, using an N-silicon substrate, with diffused P channels constituting source and drain, and a normal thin oxide or other insulating layer grown over the gate region to comprise the gate dielectric. Where an inoperative transistor is wanted ($Q_I$), the gate region is doped, as by ion-implantation techniques, to form an N+ region in the gate channel, which so increases the threshold voltage that the "transistor" cannot turn ON at the gate voltage $-V_G$ used on the X conductors. With this technique, thin oxide is grown over the gate region of all "transistors" in the memory cells 12, whether operative or inoperative. Therefore, the bit line capacitance of the Y busses in the memory section 11-L and 11-R is essentially identical on both sides, regardless of how many operative or inoperative transistors happen to be provided in each row. Using the conventional thin/thick oxide pattern to program the memory, there will be some differences between $C_L$ and $C_R$ depending on the ratio of operative and inoperative transistors on each side in the memory section of each row, but this effect can be minimized by using appropriate cell geometry.

The techniques of this invention can be used with either type of memory-programming system, or with other methods of programming; but the system is more precise with the memory of the copending application, since the total bit line capacitances $C_L$ and $C_R$ are thus as nearly equal as it is possible to make them. The reference circuit grounds $G_1$, $G_2$, $G_3$, preferably comprise the standard chip circuit ground, constituting generally a "reference node" between which and the amplifier nodes A or B, the impedance of the memory banks 11-L and 11-R and the shunting transistors $Q_7$ or $Q_8$ is connected. This can be either a normal circuit ground, such as the substrate of a MOS chip, or a biased circuit node or chip ground, where designated, as is well known in the art.

FURTHER SUMMARY AND EQUIVALENTS

In view of the foregoing description of specific embodiments and examples of the invention, it should be apparent that an extremely fast acting read-only memory system has been provided, using a sense-amplifier circuit, such as 10, to interrogate selected ROM cells and to produce a binary output signal $V_O$ in accordance with the presence or absence of a transistor in the selected ROM cell. By splitting the memory 11 into two equal halves, 11-L and 11-R, one on either side of the sense amplifier 10; by providing duplicate Y-decoding circuitry 30 on both sides, thus providing substantially equal OFF memory-bank impedance on both sides; and by providing the bank-select or shunting transistors $Q_7$ and $Q_8$, having a reference impedance $R_5$ that is large copared to the ON memory-bank resistance $R_3+R_4$ but small compared to the OFF bank impedance, this type of sense amplifier circuit 10 can conveniently be used to sense and read data from generally conventional ROM cells of various kinds.

The primary advantage of this type of system is extremely high speed; for example, 10 to 100 times faster in prior-known ROM systems of the type described in the Heeran-Winston patent. With the system described in this application, cycle times ($t_o$ to $t'_o$, FIG. 2) of the order of 500 nanoseconds to one microsecond can be achieved.

While various specific embodiments and examples of the invention have been described in detail above, it will be obvious that various modifications may be made from the specific details described, without departing from the spirit and scope of the invention.

What is claimed is:

1. An improved readout circuit for a read-only memory bank of the type having an array of memory cells and means for accessing each individual cell, each cell including a memory device programmed to have either a high impedance or a low impedance, representing stored data, the improved readout circuit being characterized by:
   a. a sense amplifier having a pair of input nodes;
   b. means for connecting the memory bank, including the selected cell impedance, between a first one of the amplifier nodes and a circuit reference node, the total impedance of the memory bank, including that of the selected cell, having a first, "ON" value if the memory device in the selected cell is in the low-impedance state, and a second, "OFF" value if the memory device is in the high-impedance state; and
   c. means for connecting a reference impedance between the other amplifier node and the reference node, the reference impedance having a value between the ON bank impedance and the OFF bank impedance;
   d. the sense amplifier including means for sensing a difference in the impedance connected to the two amplifier nodes and for generating a binary output signal in response to the sensed difference, representing the data stored in the selected memory cell.

2. A circuit as recited in claim 1, wherein the sensing and generating means includes a pair of balanced load capacitances, one connected respectively to each amplifier node.

3. A circuit as recited in claim 2, wherein:
   the memory is split into two banks of substantially equal distributed capacitance and substantially equal OFF resistance;
   a first bank being connected to a first amplifier node and the second bank being connected to the second amplifier node by the connecting means; and the balanced load capacitances comprise the distributed capacitance of the two banks of memory cells.

4. A circuit as recited in claim 3, wherein the memory banks comprise MOS read-only memories, each having a preset pattern of operative and inoperative field-effect transistors provided at various crosspoints in the memory banks in accordance with binary data stored in the memory.

5. A circuit as recited in claim 4, wherein the cell-accessing means includes parallel row busses comprising source and drain diffusions for the transistors running in one direction Y, and parallel columns of gate metalizations running in a perpendicular direction X, the load capacitances comprising the inherent distributed capacitance of the operative Y busses in each bank.

6. A circuit as recited in claim 5, wherein the ON memory bank impedance includes the source-to-drain resistance of the field-effect transistor in the selected cell, being relatively low when an operative cell transistor is formed in the selected cell and relatively high when an inoperative cell "transistor" is formed in the selected cell.

7. A circuit as recited in claim 6, wherein:
the reference impedance includes a pair of shunting field-effect transistors, one connectable respectively in parallel with each memory bank, the shunting transistors having a source-to-drain resistance that is high compared to the resistance of an OFF cell bank, but low compared to the resistance of an OFF cell bank; and
the connecting means for the reference impedance includes means for turning ON the shunting transistor in parallel with the opposite memory bank from that including the selected cell.

8. A circuit as recited in claim 7, wherein:
the accessing means includes identical Y-decoding circuitry in each memory bank for selecting a particular pair of Y busses for access, between which the selected cell transistor is located, wherein the Y-decoding circuitry selecting the same row of Y busses in each bank during each cycle of operation to equalize the OFF impedance of each bank.

9. A circuit as recited in claim 8, wherein the Y decoding circuitry includes a plurality of field-effect transistors connected between adjacent pairs of Y busses in each bank and arranged in a pattern to connect all Y busses to adjacent Y busses except for one selected pair of Y busses in each bank, which selected pair is either effectively connected or left open depending on whether an operative or an inoperative transistors is formed in a selected cell between the selected pair of Y busses.

10. A circuit as recited in claim 9, wherein:
the reference nodes comprise circuit ground, a first one of the Y busses in each bank being connected by the bank-connecting means to the corresponding amplifier node, and a last Y bus in each bank being connected to circuit ground, so that the total ON bank resistance of a bank comprises the network series source/drain resistance of all energized Y decoding transistors, plus the source/drain resistance of the selected operative cell transistor.

11. A circuit as recited in claim 10, wherein the sensing and generating means includes:
means for equalizing the potential at the two amplifier input nodes at a reference potential between zero volts and a supply voltage, during a preset phase of each cycle, the accessing means for the memory banks and the connecting means, (b) and (c) of claim 1, also operating during the preset phase and during a subsequent sensing phase of each cycle to connect the two memory banks to the respective nodes and to connect the shunting transistor to the node opposite to the bank containing the selected cell;
means, operating during the sensing phase of each cycle, for applying the supply voltage to both amplifier nodes so that the charge on the two load capacitances during the sensing phase varies in accordance with the resistance connected to each node in parallel with the load capacitances; and
flip-flop means, responsive to a difference in potential at the two amplifier nodes, for producing the binary output signal at one of the two nodes.

12. A circuit as recited in claim 11, wherein the flip-flop means grounds the node having the lower potential, and allows the other node to charge substantially to the supply voltage, the output signal being either essentially the supply voltage or essentially zero volts, depending on the presence or absence of an operative transistor at the selected cell location.

13. A circuit as recited in claim 12, wherein the two memory banks are oppositely programmed, with operative transistors representing binary 1 in one bank and binary 0 in the other, so that the binary output at the selected one of the two nodes during the sensing period consistently represents binary 1 or binary 0, regardless of which bank is selected.

14. A circuit as recited in claim 1, wherein the memory bank comprises an MOS semiconductor read-only memory, having a preset pattern of operative and inoperative field-effect transistors formed in each cell in accordance with binary data stored in the memory.

15. A circuit as recited in claim 14, wherein the ON memory bank impedance includes the source-to-drain resistance of the field-effect transistor in the selected cell, being relatively low when an operative cell transistor is formed in the selected cell and relatively high when an inoperative cell "transistor" is formed in the selected cell.

16. A circuit as recited in claim 15, wherein:
the reference impedance includes a shunting field-effect transistor having a source-to-drain resistance that is high compared to the resistance of an ON cell bank, but low compared to the resistance of an OFF cell bank.

17. A circuit as recited in claim 16, wherein:
the reference nodes comprise circuit ground;
the memory bank includes a plurality of row busses, between which the source/drain terminals of the cell transistors are connected;
the accessing circuitry includes Y-address means for connecting all row busses to each other except for one selected pair, all row busses on one side of the selected pair being connected together and through a first row bus and the bank-connecting means (b) of claim 1 to the first amplifier node; all row busses on the other side of the selected pair being connected together and through a last row bus to circuit ground;
the accessing circuitry further includes X-address means for applying a gate voltage to a selected one of a group of cell transistors connected between the selected pair of row conductors, the gate voltage being such that an operative cell transistor if present in the selected cell turns ON, but an inoperative transistor if present is effectively OFF.

18. A circuit as recited in claim 17, wherein:
the memory is split into two equal banks having the same number and layout of cells and row busses, identical Y-decoding circuitry, and substantially equal OFF bank impedance;
the bank connecting means (b) of claim 1 operating during each cycle to connect a first bank to the first amplifier node and the second bank to the second amplifier node;
the Y-address means of each bank operates during each cycle to select the same pair of Y busses in each bank during each cycle;
each bank has separate X-address means so that only one cell in one selected bank is accessed during any given cycle; and
the reference-impedance connecting means (c) of claim 1 operates to connect a reference impedance to the amplifier node associated with the nonselected bank during each cycle.

19. A circuit as recited in claim 18, wherein the two memory banks are oppositely programmed with operative transistors representing binary 1 in one bank and binary 0 in the other.

20. A circuit as recited in claim 19, wherein the sensing and generating means includes:
means for equalizing the potential at the two amplifier input nodes at a reference potential between zero volts and a supply voltage, during a preset phase of each cycle, the accessing means for the memory banks and the connecting means, (b) and (c) of claim 1, also operating during the preset phase and during a subsequent sensing phase of each cycle to connect the two memory banks to the respective nodes and to connect the shunting transistor to the node opposite to the bank containing the selected cell;
means, operating during the sensing phase of each cycle, for applying the supply voltage to both amplifier nodes so that the potential at the two nodes varies during the sensing phase in accordance with the resistance connected to each node; and
flip-flop means, responsive to a difference in potential at the two amplifier nodes, for producing the binary output signal at one of the two nodes.

21. A read-only memory, which comprises:
a. two separate memory banks, each containing an equal array of memory cells, each bank having substantially equal OFF impedance between an input node at one end of the bank and a reference node at the other end of the bank, each cell containing a memory device programmed to have either a high impedance or a low impedance in accordance with stored binary data, each bank including cell accessing means for connecting any selected cell in a selected bank between two conductors in that bank so that that bank has a relatively low, "ON" total impedance between the input node and the reference node when a low impedance device is present in the selected cell and a relatively high "OFF" total impedance when a high impedance device is present:
b. means for connection a reference impedance between the input node of the bank opposite to the selected bank and the reference node during each cycle of operation, the reference impedance having a value that is high compared to the ON bank impedance, but low compared to the OFF bank impedance; and
c. means for sensing a difference in impedance between the two input nodes and for generating a binary output signal representing the data stored in the selected memory cell.

22. A memory as recited in claim 21, wherein the two memory banks are oppositely programmed, with a low cell impedance representing binary 1 in one bank and binary 0 in the other.

23. A memory as recited in claim 22, wherein the sensing means generates the output signal at one of the two nodes, the output signal being substantially equal to a supply voltage or to circuit ground the reference nodes being connected to circuit ground potential.

24. A memory as recited in claim 23, wherein the sensing means includes a pair of balanced load capacitances, one connected respectively to each input node.

25. A memory as recited in claim 24, wherein the memory devices and the reference impedance comprise field-effect transistors, and the load capacitances comprise the distributed capacitance of the two banks of memory cells.

26. An improved readout circuit for a semiconductor ROM of the type having an array of memory cells arranged in an X-Y matrix, each cell including either an operative or an inoperative field-effect transistor having its source and drain connected to adjacent Y busses in the memory, the pattern of operative and inoperative transistors representing binary data stored in the memory; and having X-Y conductor means for accessing the memory so as to turn ON a selected cell transistor if operative, but not to turn ON a cell "transistor" if inoperative, so that the total memory bank resistance between a bank input bus and circuit ground is relatively low, ON bank resistance, if an operative transistor is present in the selected cell and relatively high, OFF bank resistance, if an inoperative "transistor" is present, the improved readout circuit being characterized by:
a. a pair of circuit nodes A and B;
b. switching means, operable during each sensing cycle, for connecting the memory bank input bus to node A so as to connect the memory bank impedance, including the source/drain resistance of the selected cell, between node A and circuit ground;
c. means for connecting a reference impedance between node B and circuit ground during each sensing cycle, the reference impedance having a resistance between the ON bank resistance and the OFF bank resistance;
D. a pair of balanced load capacitances, one connected to node A and one to node B;
e. means for applying a supply voltage to nodes A and B during each sensing cycle, so that a potential difference results on the two load capacitances, of one sense if an operative cell transistor is present in the selected cell, and of the opposite sense if an inoperative cell transistor is present; and
f. means for grounding node A if an operative cell transistor is present, and for grounding node B if an inoperative "transistor" is present, and for charging the other node to approximately the supply voltage, thus generating opposite binary output signals at nodes A and B representing the data stored in the selected ROM cell.

* * * * *